US008395571B2

(12) United States Patent
Kim et al.

(10) Patent No.: US 8,395,571 B2
(45) Date of Patent: Mar. 12, 2013

(54) PIXEL ARRANGEMENT STRUCTURE FOR ORGANIC LIGHT EMITTING DISPLAY

(75) Inventors: Gun-Shik Kim, Yongin (KR); Jae-Shin Kim, Yongin (KR); Jun-Sik Oh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 338 days.

(21) Appl. No.: 12/760,503

(22) Filed: Apr. 14, 2010

(65) Prior Publication Data
US 2011/0012820 A1 Jan. 20, 2011

(30) Foreign Application Priority Data

Jul. 14, 2009 (KR) .................. 10-2009-0063932

(51) Int. Cl.
*G09G 3/32* (2006.01)
(52) U.S. Cl. ....................................................... 345/83
(58) Field of Classification Search .............. 345/76–77, 345/83, 88, 72; 349/78–80
See application file for complete search history.

(56) References Cited

U.S. PATENT DOCUMENTS

| | | | |
|---|---|---|---|
| 6,570,584 B1 * | 5/2003 | Cok et al. ..................... | 345/690 |
| 7,400,332 B2 * | 7/2008 | Schweng et al. .............. | 345/589 |
| 7,728,514 B2 * | 6/2010 | Rogojevic et al. ............ | 313/504 |
| 2001/0028334 A1 * | 10/2001 | Ishizuka ...................... | 345/76 |
| 2004/0246426 A1 * | 12/2004 | Wang et al. .................. | 349/146 |
| 2007/0064020 A1 | 3/2007 | Credelle et al. | |
| 2010/0059753 A1 * | 3/2010 | Andrews et al. .............. | 257/59 |

FOREIGN PATENT DOCUMENTS

| | | |
|---|---|---|
| JP | 07-261166 | 10/1995 |
| JP | 2004-347930 | 12/2004 |
| KR | 1020030086399 A | 11/2003 |
| KR | 10-0634508 B1 | 10/2006 |
| KR | 1020070109674 A | 11/2007 |
| KR | 1020070121154 A | 12/2007 |

OTHER PUBLICATIONS

KIPO Office action dated Jan. 20, 2011, for Korean priority Patent application 10-2009-0063932.
Korean Patent Abstracts, Publication No. 1020060008134, dated Jan. 26, 2006, corresponding to Korean Patent 10-0634508.

* cited by examiner

*Primary Examiner* — Chanh Nguyen
*Assistant Examiner* — Roy Rabindranath
(74) *Attorney, Agent, or Firm* — Christie, Parker & Hale, LLP

(57) ABSTRACT

A pixel arrangement structure for an organic light emitting display including a plurality of sub-pixel groups repeatedly arranged, wherein each of the sub-pixel groups includes: four first sub-pixels for emitting light of a first color and each having a hexagonal structure, two second sub-pixels for emitting light of a second color and each including two hexagonal structures sharing one side, and two third sub-pixels for emitting light of a third color and each including two hexagonal structures sharing one side. Two of the four first sub-pixels are arranged in a same column and share a symmetrical axis, and the two second sub-pixels and the two third sub-pixels are alternately arranged on either side of the symmetrical axis.

14 Claims, 2 Drawing Sheets

(12) United States Patent
US 8,395,571 B2

PIXEL ARRANGEMENT STRUCTURE FOR ORGANIC LIGHT EMITTING DISPLAY

CROSS-REFERENCE TO RELATED APPLICATION

This application claims priority to and the benefit of Korean Patent Application No. 10-2009-0063932, filed on Jul. 14, 2009, in the Korean Intellectual Property Office, the entire content of which is incorporated herein by reference.

BACKGROUND

1. Field

The following description relates to a pixel arrangement structure for an organic light emitting display.

2. Description of the Related Art

An organic light emitting display displays an image using an organic light emitting diode (OLED) for emitting light. OLEDs have high brightness and chromatic purity, thereby contributing to the organic light emitting display as being a next generation display.

The organic light emitting display consists of a plurality of pixels including red sub-pixels, green sub-pixels, and blue sub-pixels, to display various color images.

The red sub-pixels, the green sub-pixels, and the blue sub-pixels may be arranged in various forms, such as a stripe form, a mosaic form, and a delta form.

In the stripe form, sub-pixels of the same color are arranged in units of columns. In the mosaic form, the red sub-pixels, the green sub-pixels, and the blue sub-pixels are sequentially arranged in both column and row directions. In the delta form, the red sub-pixels, the blue sub-pixels, and the green sub-pixels are sequentially arranged so that the sub-pixels are arranged in a zig-zag form.

In addition, "ClairVoyante Laboratories" suggested a pixel arrangement structure named "the Pentile Matrix Color Pixel Arrangement". When "the Pentile Matrix Color Pixel Arrangement" is applied, relatively high resolution display ability is obtained and, although resolution is not exceptionally high, vertical line patterns caused by specific pixels are not visualized, such that picture characteristics can be improved.

SUMMARY OF THE INVENTION

Accordingly, exemplary embodiments of the present invention provide a pixel arrangement structure for an organic light emitting display for securing a desired aperture ratio while displaying high resolution.

In one exemplary embodiment of the present invention, there is provided a pixel arrangement structure for an organic light emitting display including a plurality of sub-pixel groups repeatedly arranged. Each of the sub-pixel groups includes: four first sub-pixels for emitting light of a first color and each having a hexagonal structure, two second sub-pixels for emitting light of a second color and each including two hexagonal structures sharing one side, and two third sub-pixels for emitting light of a third color and each including two hexagonal structures sharing one side. Two of the four first sub-pixels are arranged in a same column and share a symmetrical axis. The two second sub-pixels and the two third sub-pixels are alternately arranged on either side of the symmetrical axis.

The first sub-pixels may be green sub-pixels, the second sub-pixels may be red sub-pixels, and the third sub-pixels may be blue sub-pixels.

The symmetrical axis may pass through corners of the two of the four first sub-pixels. A second sub-pixel of the two second sub-pixels and a corresponding third sub-pixel of the two third sub-pixels in a same row may be arranged to be symmetrical with each other along the symmetrical axis.

The first sub-pixels of the plurality of sub-pixel groups may be arranged in a zig-zagging arrangement.

The two second sub-pixels of each of the sub-pixel groups may be arranged to have different axes of symmetry. Each of the two third sub-pixels of each of the sub-pixel groups may be in a same column as a corresponding one of the two second sub-pixels and may be arranged in a same direction as the corresponding second sub-pixel in the same column.

In the repeatedly arranged pattern of the plurality of sub-pixel groups, a number of the first sub-pixels may correspond to a resolution of the organic light emitting display, and a number of the second sub-pixels and a number of the third sub-pixels may correspond to half of the resolution of the organic light emitting display.

When a "Pentile Matrix Color Pixel Arrangement" is formed by using square-shaped sub-pixels, an optimal or desired aperture ratio may be difficult to realize. According to exemplary embodiments of the present invention, by modifying the "Pentile Matrix Color Pixel Arrangement" by utilizing hexagonal sub-pixels or sub-pixels having a modified structure based on a hexagonal structure, a desired aperture ratio may be more readily achieved. Additionally, efficiency and life of the OLED display, as well as image sticking of the OLED display, may be improved.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE INVENTION

Figure 1:
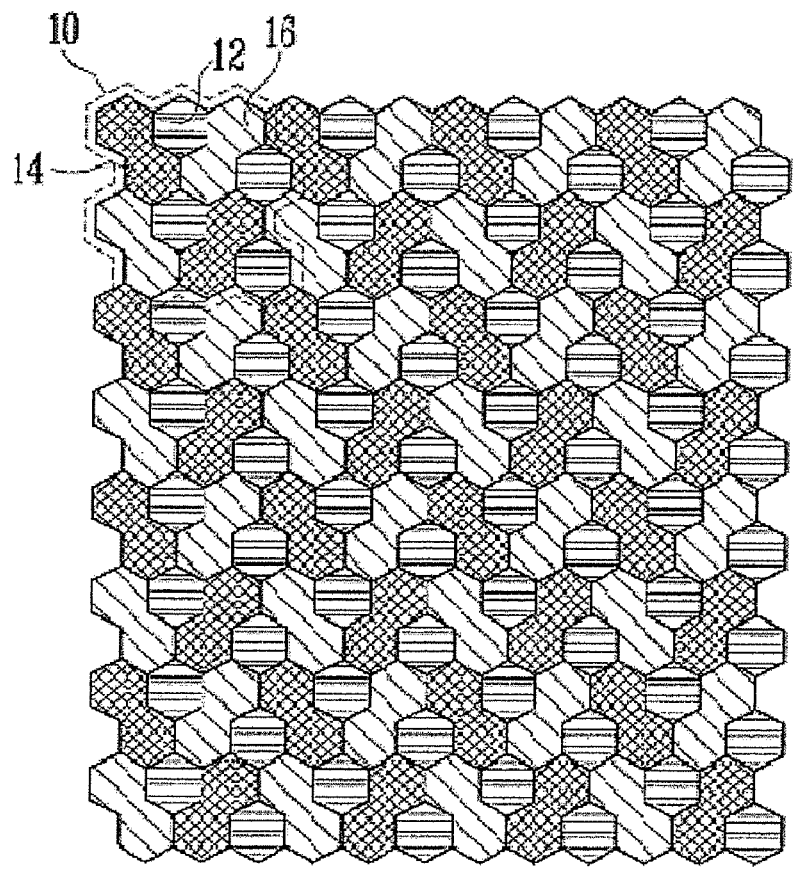
FIG. 1 is a plan view illustrating a pixel arrangement structure according to an embodiment of the present invention.

In the following detailed description, only certain exemplary embodiments of the present invention have been shown and described by way of illustration. As those skilled in the art will recognize, the described embodiments may be modified in various different ways without departing from the spirit or scope of the present invention. Accordingly, the drawings and description are to be regarded as illustrative in nature and not restrictive. In addition, when an element is referred to as being "on" another element, it may be directly on the other element, or may be indirectly on the other element, with one or more elements interposed therebetween. Also, when an element is referred to as being "connected to" another element, it may be directly connected to the other element, or may be indirectly connected to the other element, with one or more elements interposed therebetween. Hereinafter, like reference numerals refer to like elements.

Hereinafter, the embodiment of the present invention will be described in detail with reference to the accompanying drawings.

Figure 2:
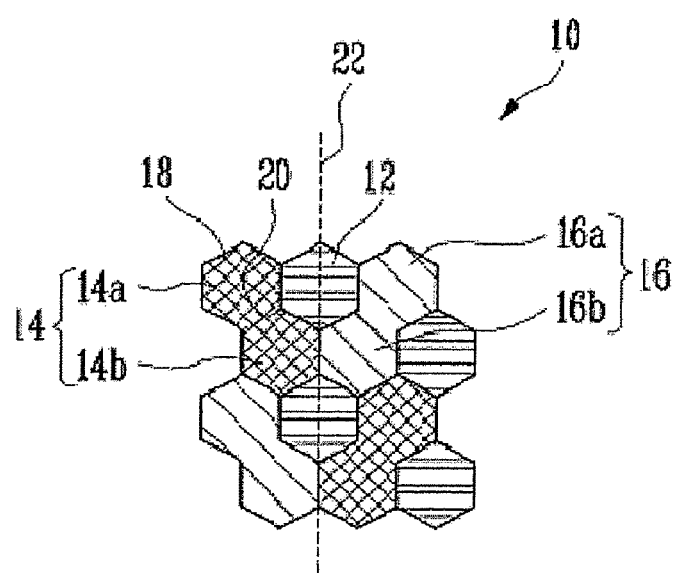
FIG. 2 is an enlarged plan view illustrating the sub-pixel group of FIG. 1.

FIG. 1 is a plan view illustrating a pixel arrangement structure according to an embodiment of the present invention. FIG. 2 is an enlarged plan view illustrating the sub-pixel group of FIG. 1.

Referring to FIGS. 1 and 2, in the pixel arrangement structure according to the embodiment of the present invention, a plurality of sub-pixel groups 10 each consisting of hexagonal sub-pixels 12, 14, and 16 are repeatedly arranged.

Here, the sub-pixel group 10 provides an arrangement of sub-pixels having a pattern that is repeated, and includes a plurality of first sub-pixels 12, second sub-pixels 14, and third sub-pixels 16.

The first sub-pixels 12 emit light of a first color and are hexagonal. Four first sub-pixels 12 are provided in each sub-pixel group 10. The four first sub-pixels 12 are arranged, such that two sub-pixels 12 are in a same column and share a first symmetrical axis 22.

Here, the first symmetrical axis 22 passes through corners of the two first sub-pixels 12 positioned in the same column. For example, the first symmetrical axis 22 may pass through the corners of the two first sub-pixels 12 that are facing or pointed towards one another. The first sub-pixels 12 are arranged in a column direction, so that the first symmetrical axis 22 forms a continuous vertical line in an entire pixel arrangement structure (e.g., in a pattern in which a plurality of sub-pixel groups 10 are repeatedly arranged in a column direction).

The plurality of first sub-pixels 12 are alternately arranged, so that in the pattern where the plurality of sub-pixel groups 10 are repeatedly arranged, the first sub-pixels positioned in a first column and the first sub-pixels positioned in a second column are not positioned in the same row. For convenience, a row is based on one hexagon sub-pixel. The plurality of first sub-pixels 12 are alternately arranged, so that the first sub-pixels positioned in a first row and the first sub-pixels positioned in a second row adjacent to the first row are not positioned in the same column. That is, the plurality of first sub-pixels 12 are arranged in a zig-zagging configuration or arrangement in the entire pixel arrangement structure.

The second sub-pixels 14 emit light of a second color and have a structure, in which two hexagons share one side 20. That is, the second sub-pixel 14 includes a first hexagonal region 14a and a second hexagonal region 14b. Two such second sub-pixels 14 are provided in each sub-pixel group 10. The two second sub-pixels 14 are alternately positioned in one sub-pixel group 10 in a diagonal direction, as illustrated in FIG. 2.

The third sub-pixels 16 emit light of a third color and have a structure, in which two hexagons share one side similar to the second sub-pixels 14. That is, the third sub-pixels 16 include a first hexagonal region 16a and a second hexagonal region 16b. Two such third sub-pixels 16 are provided in each sub-pixel group 10. The two third sub-pixels 16 provided in one sub-pixel group 10 are alternately positioned in the sub-pixel group 10 in a diagonal direction, as illustrated in FIG. 2. The second and third sub-pixels 14 and 16 are alternately arranged, similarly to a checker board.

On the other hand, among the two second sub-pixels 14 and the two third sub-pixels 16 provided in one sub-pixel group 10, the second sub-pixel 14 and the third sub-pixel 16 positioned in the same row are arranged to be linearly symmetrical with each other based on the first symmetrical axis 22.

To be specific, the first hexagonal region 14a of the second sub-pixel 14 and the first hexagonal region 16a of the third sub-pixel 16 are sequentially arranged in a same row with the first sub-pixel 12 interposed.

The second hexagonal region 14b of the second sub-pixel 14 and the second hexagonal region 16b of the third sub-pixel 16 may be arranged in a same row, such that each of these second hexagonal regions has a side positioned along the first symmetrical axis 22. That is, when there are no empty spaces or gaps between the sub-pixels 12, 14, and 16 and the sub-pixels 12, 14, and 16 are closely arranged, one side of the second hexagonal region 14b of the second sub-pixel 14 and one side of the second hexagonal region 16b of the third sub-pixel 16 may contact each other along the first symmetrical axis 22.

The two second sub-pixels 14 provided in one sub-pixel group 10 are arranged in different directions so that the symmetrical axis of the two sub-pixels 14 does not coincide with each other (for example, the two second sub-pixels 14 are offset in a row direction and have rotated orientations). In addition, the two third sub-pixels 16 are arranged in different directions so that the symmetrical axis does not coincide with each other, similarly to the second sub-pixels 14. That is, the second sub-pixel 14 and the third sub-pixel 16 are alternately arranged, similarly to a checker board, and are alternately arranged in both first and second directions.

The second sub-pixel 14 and/or the third sub-pixel 16 positioned in the same column are arranged in the same direction.

For example, each third sub-pixels 16 provided in one sub-pixel group 10 is positioned in a same column as one of the second sub-pixels 14, and is arranged in the same direction as the second sub-pixel 14 positioned in the same column.

As described above, according to the embodiment of the present invention, high resolution can be displayed by utilizing "the Pentile Matrix Color Pixel Arrangement". "The Pentile Matrix Color Pixel Arrangement" may be driven to display high resolution using, for example, the "sub-pixel rendering method," similarly as disclosed in the Korean Patent Publication No. 2003-0086399.

According to an exemplary embodiment of the present invention, the sub-pixels 12, 14, and 16 are formed to have a hexagonal structure or a modified structure based on a hexagon and are arranged so that dead space or gaps are minimized. Such a hexagonal structure may be optimal or assist in improving an aperture ratio. Therefore, according to the embodiment of the present invention, by securing a high aperture ratio, the efficiency and life of the OLED may be increased and the image sticking of the OLED may be improved.

In addition, according to the embodiment of the present invention, in the pattern where the plurality of sub-pixel groups 10 are repeatedly arranged, where a number of first sub-pixels 12 corresponds to the resolution of the display, a number of second sub-pixels 14 and a number of third sub-pixels 16 may correspond to half of the resolution of the display.

Here, the first sub-pixels 12 may be set as sub-pixels having a color that is more sensitive to resolution, for example, green sub-pixels, so that a high quality image can be provided.

The second sub-pixels 14 and the third sub-pixels 16 may be set as red sub-pixels or blue sub-pixels and are formed to have a structure, in which two hexagons are put together. In this case, since one side 20 shared by the two hexagons does not actually become a dead space unlike the boundary 18 of the sub-pixels 12, 14, and 16, it may help with securing a desired aperture ratio.

In the present embodiment, the area of one second sub-pixel 14 or third sub-pixel 16 is illustrated as being twice the area of one first sub-pixel 12. However, the present invention is not limited to the above. That is, the areas of the first sub-pixel 12, the second sub-pixel 14, and the third sub-pixel 16 may be changed based on various factors, for example, the life of materials respectively utilized in each color sub-pixel.

Figure 3:
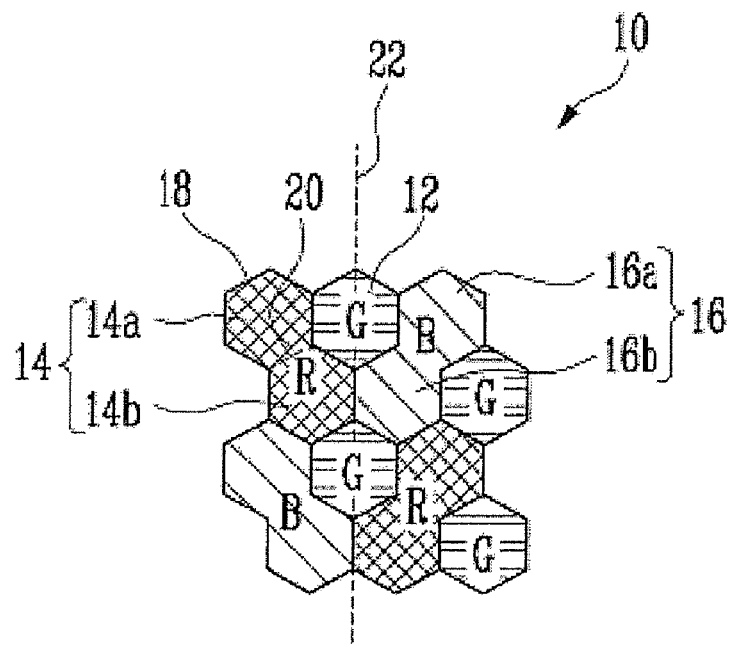
FIG. 3 is a plan view illustrating an example of a color arrangement that may be applied to the sub-pixel group of FIG. 2.
Figure 4:
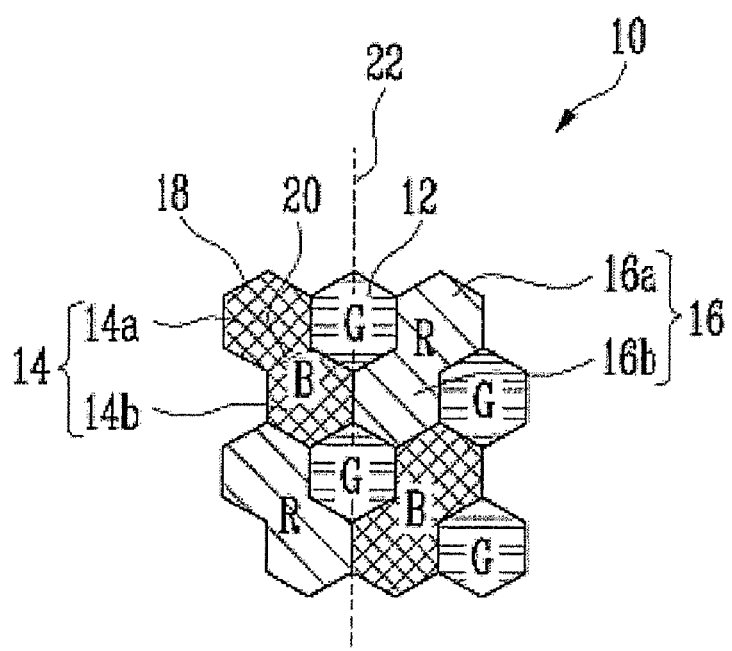
FIG. 4 is a plan view illustrating another example of a color arrangement that may be applied to the sub-pixel group of FIG. 2.

FIG. 3 is a plan view illustrating an example of a color arrangement that may be applied to the sub-pixel group of FIG. 2. FIG. 4 is a plan view illustrating another example of a color arrangement that may be applied to the sub-pixel group of FIG. 2.

First, referring to FIG. 3, the first sub-pixel 12 may be set as a green sub-pixel G that may be more sensitive to resolution, and the second sub-pixel 14 and the third sub-pixel 16 may respectively be set as a red sub-pixel R and a blue sub-pixel B that may be less sensitive to resolution.

In another embodiment as illustrated in FIG. 4, the first sub-pixel 12 may be set as the green sub-pixel G and the second sub-pixel 14 and the third sub-pixel 16 may be set as the blue sub-pixel B and the red sub-pixel R, respectively.

While the present invention has been described in connection with certain exemplary embodiments, it is to be understood that the invention is not limited to the disclosed embodiments, but is instead intended to cover various modifications and equivalent arrangements included within the spirit and scope of the appended claims, and equivalents thereof.

What is claimed is:

1. A pixel arrangement structure for an organic light emitting display comprising a plurality of sub-pixel groups repeatedly arranged, wherein each of the sub-pixels group comprises:
    four first sub-pixels for emitting light of a first color and each having a hexagonal structure;
    two second sub-pixels for emitting light of a second color, each of the second sub-pixels comprising two hexagonal structures sharing one side with one another; and
    two third sub-pixels for emitting light of a third color, each of the third sub-pixels comprising two hexagonal structures sharing one side with one another,
    wherein two of the four first sub-pixels are arranged in a same column and share a symmetrical axis, and
    wherein the two second sub-pixels and the two third sub-pixels are alternately arranged on either side of the symmetrical axis, such that a first one of the second sub-pixels is arranged above a second one of the third sub-pixels on a first side of the symmetrical axis and a first one of the third sub-pixels is arranged above a second one of the second sub-pixels on a second side of the symmetrical axis.

2. The pixel arrangement structure as claimed in claim 1, wherein the first sub-pixels are green sub-pixels, the second sub-pixels are red sub-pixels, and the third sub-pixel are blue sub-pixels.

3. The pixel arrangement structure as claimed in claim 1, wherein the symmetrical axis passes through corners of the two of the four first sub-pixels.

4. The pixel arrangement structure as claimed in claim 3, wherein a second sub-pixel of the two second sub-pixels and a corresponding third sub-pixel of the two third sub-pixels in a same row are arranged to be symmetrical with each other along the symmetrical axis.

5. The pixel arrangement structure as claimed in claim 4,
    wherein the second sub-pixel and the corresponding third sub-pixel each comprises a first hexagonal region and a second hexagonal region,
    wherein the first hexagonal region of the second sub-pixel and the first hexagonal region of the third sub-pixel are arranged in a same row, with one of the four first sub-pixels interposed therebetween, and
    wherein the second hexagonal region of the second sub-pixel and the second hexagonal region of the third sub-pixel are arranged in a same row and share a side along the symmetrical axis.

6. The pixel arrangement structure as claimed in claim 3, wherein two of the corners that the symmetrical axis passes through are facing one another.

7. The pixel arrangement structure as claimed in claim 1, wherein the first sub-pixels of the plurality of sub-pixel groups are arranged in a zig-zagging arrangement.

8. The pixel arrangement structure as claimed in claim 1, wherein in the repeatedly arranged pattern of the plurality of sub-pixel groups, one of the first sub-pixels in a first column and a closest one of the first sub-pixels in a second column are in different rows.

9. The pixel arrangement structure as claimed in claim 1, wherein the two second sub-pixels of each of the sub-pixel groups are arranged to have different axes of symmetry.

10. The pixel arrangement structure as claimed in claim 9, wherein each of the two third sub-pixels of each of the sub-pixel groups is in a same column as a corresponding one of the two second sub-pixels and is arranged in a same direction as the corresponding second sub-pixel in the same column.

11. The pixel arrangement structure as claimed in claim 1, wherein in the repeatedly arranged pattern of the plurality of sub-pixel groups, a number of the first sub-pixels corresponds to a resolution of the organic light emitting display, and wherein a number of the second sub-pixels and a number of the third sub-pixels correspond to half of the resolution of the organic light emitting display.

12. The pixel arrangement structure as claimed in claim 1, wherein the two second sub-pixels and the two third sub-pixels are arranged substantially in a checker board arrangement.

13. The pixel arrangement structure as claimed in claim 1, wherein in each of the sub-pixel groups, a total area of the first sub-pixels, a total area of the second sub-pixels, and a total area of the third sub-pixels are substantially equal.

14. The pixel arrangement structure as claimed in claim 1, wherein in the repeatedly arranged pattern of the plurality of sub-pixel groups, the symmetrical axis of a first sub-pixel group and the symmetrical axis of a second sub-pixel group in a same column as the first sub-pixel group are aligned with one another.

* * * * *